United States Patent
Smith

[11] Patent Number: 6,114,763
[45] Date of Patent: Sep. 5, 2000

[54] SEMICONDUCTOR PACKAGE WITH TRANSLATOR FOR CONNECTION TO AN EXTERNAL SUBSTRATE

[75] Inventor: John W. Smith, Palo Alto, Calif.

[73] Assignee: Tessera, Inc., San Jose, Calif.

[21] Appl. No.: 09/087,739

[22] Filed: May 29, 1998

Related U.S. Application Data

[60] Provisional application No. 60/048,146, May 30, 1997.

[51] Int. Cl.[7] .......................... H01L 23/34; H01L 23/10; H01L 23/04
[52] U.S. Cl. .......................... 257/738; 257/737; 257/778; 257/779; 257/692; 257/693; 257/780; 257/784
[58] Field of Search ...................... 257/738, 734, 257/777, 778, 692, 693, 723, 780, 787, 779, 786, 784

[56] References Cited

U.S. PATENT DOCUMENTS

| | | |
|---|---|---|
| 4,807,021 | 2/1989 | Okumura ................................. 257/777 |
| 5,148,265 | 9/1992 | Khandros et al. ....................... 257/773 |
| 5,148,266 | 9/1992 | Khandros et al. ....................... 257/773 |
| 5,293,072 | 3/1994 | Tsuji et al. ............................... 257/737 |
| 5,329,423 | 7/1994 | Scholz ..................................... 361/760 |
| 5,518,964 | 5/1996 | DiStefano et al. ...................... 438/113 |
| 5,521,435 | 5/1996 | Mizukoshi ............................... 257/698 |
| 5,615,824 | 4/1997 | Fjelstad et al. ......................... 228/180.1 |
| 5,632,631 | 5/1997 | Fjelstad et al. ............................. 439/82 |
| 5,637,920 | 6/1997 | Loo .......................................... 257/700 |
| 5,668,885 | 9/1997 | Oda ............................................ 381/98 |
| 5,685,885 | 11/1997 | Khandros et al. ......................... 29/841 |
| 5,783,865 | 7/1998 | Higashiguchi et al. ................. 257/774 |
| 5,802,699 | 9/1998 | Fjelstad et al. ............................ 29/593 |
| 5,866,943 | 2/1999 | Mertol ..................................... 257/712 |
| 5,892,271 | 4/1999 | Takeda et al. ........................... 257/668 |
| 5,892,288 | 4/1999 | Muraki et al. ........................... 257/778 |
| 5,898,223 | 4/1999 | Frye et al. ............................... 257/777 |
| 5,903,058 | 5/1999 | Akram ..................................... 257/778 |
| 5,920,120 | 7/1999 | Webb et al. ............................. 257/719 |
| 5,925,934 | 7/1999 | Zim ......................................... 257/778 |

*Primary Examiner*—Alexander O. Williams
*Attorney, Agent, or Firm*—Lerner, David, Littenberg, Krumholz & Mentlik, LLP

[57] ABSTRACT

An electronic assembly which includes a semiconductor chip package having an array of package terminals and a translator. The translator has a first array of terminals exposed on a first surface of the translator and a second array of terminals exposed on a second surface of the translator. The pitch of the first array matches the pitch of the semiconductor package. The pitch of the second array matches the pitch of the printed circuit board to which the electronic assembly is to be mounted. The array of package terminals on the semiconductor chip package is aligned with and bonded to the first array of terminals on the translator to form the electronic assembly. The electronic assembly can then be mounted on a board by aligning and bonding the second array of terminals on the translator with the connection pads on the printed circuit board.

27 Claims, 4 Drawing Sheets

SEMICONDUCTOR PACKAGE WITH TRANSLATOR FOR CONNECTION TO AN EXTERNAL SUBSTRATE

CROSS REFERENCE TO RELATED APPLICATIONS

This application claims benefit of U.S. Provisional Patent Application Ser. No. 60/048,146 filed May 30, 1997, the disclosure of which is incorporated herein by reference.

FIELD OF THE INVENTION

The present invention relates to art of electronic packaging, and more specifically to assemblies incorporating microelectronic components.

BACKGROUND OF THE INVENTION

Modern electronic devices utilize integrated circuits, commonly referred to as "semiconductor chips" which incorporate numerous electronic elements. These chips are mounted on substrates that physically support the chips and electrically interconnect each chip with other elements of the circuit. The substrate may be a printed circuit board or card, or part of a discrete chip package, such as a single chip package (which is also referred to as a semiconductor chip package) or multi-chip package. The chip package is typically incorporated into a larger circuit by being mounted on a printed circuit board. An interconnection between the chip and the chip package is commonly referred to as a "first level" assembly or chip interconnection. An interconnection between the chip package and a printed circuit board or card is commonly referred to as a "second level" interconnection. If the chip is mounted directly on a printed circuit board, the interconnection between the bare chip and the board is intermediate between a first and second level interconnection.

The structures utilized to provide the first level connection between the chip and the substrate of the chip package must accommodate all of the required electrical interconnection to the chip. The center to center distance between one I/O and an adjacent I/O is typically referred to as the pitch. As chip technology advances, the number of first level connections to external circuit elements, commonly referred to as "input-output" or "I/O" connections per chip tends to increase. If the size of the chip remains constant then the pitch must be smaller to accommodate the increased number of I/O's in the same area. Advances in chip technology, however, frequently also allow the production of smaller chips having the same or a greater degree of functionality. Generally, as the chip size decreases and the number of chip contacts increase, the pitch of the second level interconnections becomes smaller and smaller. For example it is not uncommon for chip scale packages, such as the packages disclosed in commonly assigned U.S. Pat. Nos. 5,148,265 and 5,148,266 to have a terminal pitch of 750 $\mu$m or less.

In order to make a second level interconnection between a semiconductor chip package having closely spaced I/O's and a printed circuit board, the pitch of the I/O's of the package and the pitch of the connection pads on the printed circuit board must be the same. If they are different the I/O's will not align with the connection pads, and the package and the board will not be electrically interconnected. When a package having terminals in the form of a pin grid array ("PGA") is plugged into a printed circuit board, the apertures on the board must be aligned with and have the same pitch as the pins of the PGA. The same is true of ball grid arrays ("BGA's), where the solder balls of the BGA must be aligned with connection pads on the printed circuit board and with flip chip die where the solder bumps on the bare die must be aligned with connection pads on the printed circuit board. The pitch of many chip scale packages and of some conventional semiconductor chip packages is smaller than the pitch of standard printed circuit boards. For example, printed circuit boards made from FR-4 having connection pads with a pitch of 1000 $\mu$m or more are commonly available. If a smaller pitch is needed, the printed circuit board must typically be made of a more esoteric, and expensive material, such as BT resin. It is desirable to have the ability to mount a packages having a small pitch to a standard low cost printed circuit board having a larger pitch.

Even if the availability of lower cost printed circuit boards with small pitches should increase, there is still a need to be able to connect a package having one pitch with a printed circuit board having another pitch. This ability is desirable when one of the components to be mounted to a printed circuit board has a pitch which is different from the pitch of the other components and of the board. Such a situation might occur with high volume components that are most affordable in a particular pitch or with low volume components which may only be available in a limited number of configurations. The semiconductor chip package and translator of the present invention allows a package with one pitch to be mounted to a board having a different pitch.

In addition, it is also desirable to manufacture semiconductor chip packages in wafer level process. A wafer level process can provide significant advantages in handling and process chips. However, wafer-level processing is not normally used to form fan-out or fan-in/fan-out structures. A wafer level package having a fan-out structure will intrinsically be larger than its silicon die and would therefor waste silicon and reduce the number of die per wafer. These economic concerns usually rule out wafer level packaging processes that are larger than the chip.

SUMMARY OF THE INVENTION

The present invention relates to an electronic assembly which includes a semiconductor chip package and a translator. The translator is used to step up or step down the pitch of the package to match the pitch of the printed circuit board or external substrate to which the package is to be mounted. The semiconductor chip package includes a semiconductor chip and an array of electrically conductive terminals disposed on the face surface of the package. In preferred embodiments, the semiconductor chip package is selected from the packages described in commonly assigned U.S. Pat. Nos. 5,148,265; 5,148,266; 5,518,964; 5,685,885; and 5,668,885, the disclosures of which are incorporated herein by reference. The translator includes a flexible, sheet-like support element having an array of electrically conductive terminals (hereinafter "first translator terminals"). This array of first translator terminals has a pitch which corresponds to the pitch of the semiconductor chip package. Typically, this array is located on a central region of the support element and the first terminals are exposed to the surface of the support element which faces the package. The translator also has a second array of electrically conductive terminals (hereinafter "second translator terminals") disposed on the support element and exposed on the second surface of the translator. If the translator is used to connect a package have a small pitch to a printed circuit board having a larger pitch, at least some of the second translator terminals will be disposed on the peripheral region of the support element.

The support element of the translator should be made of a flexible material, such as polyimide. Since the footprint of the translator will typically be larger than the footprint of the semiconductor chip package, it may be necessary for the region of the translator which extends beyond the edges of the semiconductor chip package to have additional structural integrity. This is typically done by making the peripheral region of the support element more rigid, such as, for example by incorporating a stiffener, such as a ring of plastic, metal or other rigid material, into the support element.

The pitch of the array of first translator terminals is the same as the pitch of the semiconductor chip package. The pitch of the array of second translator terminals is the same as the pitch the printed circuit bard, or other external substrate to which the assembly will be mounted. The package can be mounted on the board by using a translator having a pitch on a first surface corresponding to the pitch of the package and a pitch on a second surface corresponding to the pitch of the board. The translator of the electronic assembly of the present invention present may also function as a socket such as the components described in commonly assigned U.S. Pat. Nos. 5,615,824; and 5,632,631; and commonly assigned U.S. patent application Ser. Nos. 08/254,991, filed on Jun. 7, 1994; and 08/862,151, filed on May 22, 1997, the disclosures of which are incorporated herein by reference. When functioning as such a component, the translator may include, as described in the '991 patent application, a plurality of holes which are aligned in an array corresponding to the array of package terminals. Each of the first translator terminals is disposed over one of the holes is functions as a resilient, generally laminar contact that extends inwardly over the hole and is adapted to resiliently engage a package terminal.

The translator of the electronic assembly of the present invention may also be used to route one or more signals from one portion of the package to another by, for example, incorporating a trace which interconnects one package terminal to a different package terminal.

The present invention also relates to a method of making a electronic assembly. The method includes the steps of providing a semiconductor chip package having an array of package terminals and a translator. The translator has an array of first translator terminals with a pitch which corresponds to the pitch of the semiconductor chip package. The translator also has a array of second translator terminals with a pitch which corresponds to the pitch of the substrate to which the semiconductor chip is to be mounted. The package and translator are juxtaposed, such that the package terminals and the first translator terminals are aligned, and bonded together. The semiconductor chip package of the present invention may include leads connecting the semiconductor chip to a dielectric layer. The semiconductor chip package may be made in a wafer level process wherein a subassembly incorporating many chips is formed on a wafer. The chips are then severed from the wafer subassembly to from a plurality of semiconductor chip packages, each incorporating a chip, a dielectric layer and leads. A wafer level process, such as the process described in U.S. Pat. No. 5,518,964, provides significant advantages in handling and process chips, such as the ability to process numerous chips which many contacts and provide packages with a large number of terminals on a small pitch. Such packages may be mounted on external substrates having pitches which differ from the small pitch of the package by juxtaposing and bonding a translator having a first pitch which matches the package pitch and a second pitch which matches the external substrate pitch.

DETAILED DESCRIPTION OF THE PREFERRED EMBODIMENTS

Figure 1A:
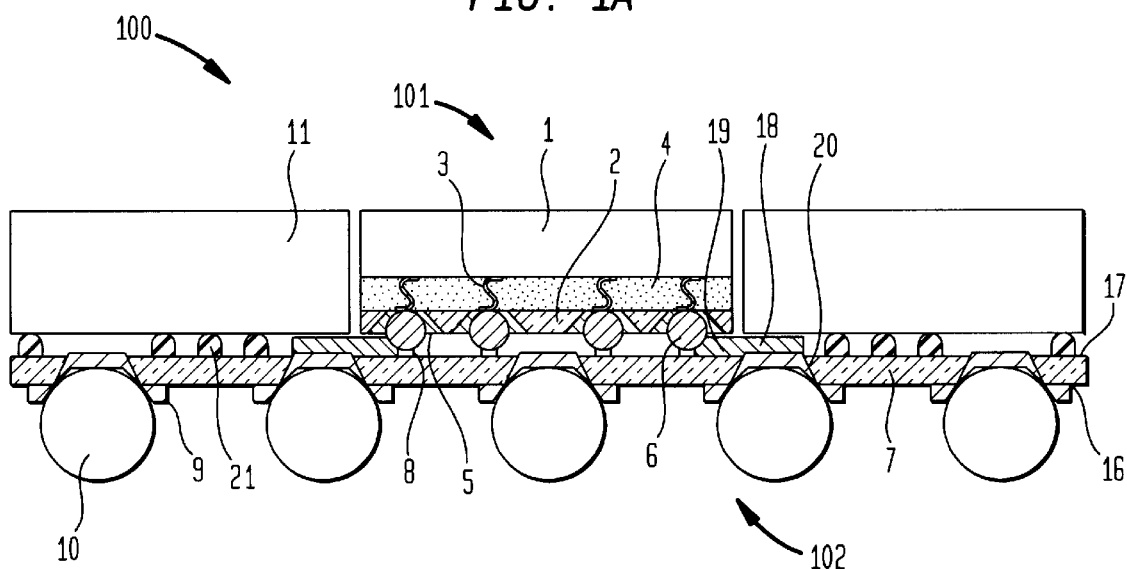
FIG. 1A is a side view of the electronic assembly according to one embodiment of the of the present invention.

FIG. 1A depicts an electronic assembly 100, according to one embodiment of the present invention. Electronic assembly 100 includes a semiconductor chip package 101, and a translator 102. Semiconductor chip package 101 includes a semiconductor chip 1 having a plurality of electrically conductive contacts (not shown) and a dielectric layer 2. A plurality of electrically conductive terminals 5, hereinafter referred to as package terminals 5 are disposed on dielectric layer 2. Semiconductor chip package 101 further includes a plurality of electrically conductive leads, hereinafter referred to as leads 3. Each lead 3 connects one of the contacts on semiconductor chip 1 to one of the package terminals 5 on dielectric layer 2. In a "fan-in" arrangement, the package terminals are disposed on the dielectric layer in the region bounded by the footprint of the semiconductor chip. Although the contacts on the chip may be disposed in any arrangement, they typically are disposed in rows along the periphery of the face of the chip. In such a configuration, the leads connecting the contacts on the chip to the package terminals fan inwardly. In a "fan-out" arrangement, the package terminals are generally disposed in a region that is outside the region that is bounded by the footprint of the chip. The leads connecting the terminals to the contacts on the semiconductor chip fan outwardly. In a "fan-in/fan-out" arrangement, some package terminals are disposed inside the region bounded by the footprint of the chip and some are disposed outside such region. Each of the leads depicted in FIG. 1A is a fan-in lead Package terminals 5 are arranged in a rectilinear grid array having a consistent center to center distance, or pitch (hereinafter referred to as the "first pitch"). In preferred embodiments the first pitch is less than 1000 $\mu$m, more preferably less than 750 $\mu$m, and most preferably less than 500 $\mu$m. Only a portion of such array is depicted in FIG. 1A. A compliant encapsulant 4, such as a silicone gel, a silicone elastomer or a flexiblized epoxy or blends thereof, is disposed between semiconductor chip 1 and flexible dielectric layer 2. Semiconductor chip package 101 further includes a plurality of electrically conductive joining units, hereinafter referred to as first joining units 6. Each first joining unit 6 is connected to one of the package terminals 5.

The translator 102 includes a support element 7 which is comprised of at least one sheet-like dielectric element. Support element 7 has a first surface 17 which faces towards semiconductor chip package 101 and a second surface 16 opposite the first surface 17. Translator 102 also has a plurality of electrically conductive terminals 8 which are disposed in an array which is aligned with and has essentially the same pitch as the array of package terminals 5. Such terminals are hereinafter referred to as first translator terminals 8. Such pitch is equivalent to the first pitch. First-translator terminals 8 are disposed in the central region of the first surface 17 of support element 7. Terminals 8 may be disposed on the first surface and/or the second surface, although such terminals 8 would normally only be disposed on either the first surface or the second surface. Translator 102 also has a second set of terminals, hereinafter referred to as second translator terminals 9. Terminals 9 may be disposed on the first surface and/or the second surface, although such terminals 9 would normally only be disposed on either the first surface or the second surface. Second translator terminals 9 are arranged in an array having a pitch which is hereinafter referred to as the second pitch. In preferred embodiments the second pitch is greater than 1000 $\mu$m. Each first translator terminal 8 is connected to one of the second-translator-terminals 9 via a trace 18. Each trace 18 is electrically interconnected to a plated via 20. Translator 102 also includes a compliant ring which is disposed on the first surface 17 of the support element 7 and is comprised of a plurality of compliant spacers 21. A plurality of electrically conductive joining units, hereinafter referred to as second joining units 10 are disposed on the second surface 16 of support element 7. Each of the second joining units 10 is connected to one of the second-translator-terminals 9, and is therefor arranged in an array which is aligned with and has the same third pitch as the array of second translator terminals. Translator 102 also has spacer or stiffener 11 which is disposed over the peripheral region of the first surface 17 of support element 7. Stiffener 11 is in the shape of a rectilinear ring having a central opening or hole which is large enough to accommodate semiconductor chip package 101.

Figure 1B:
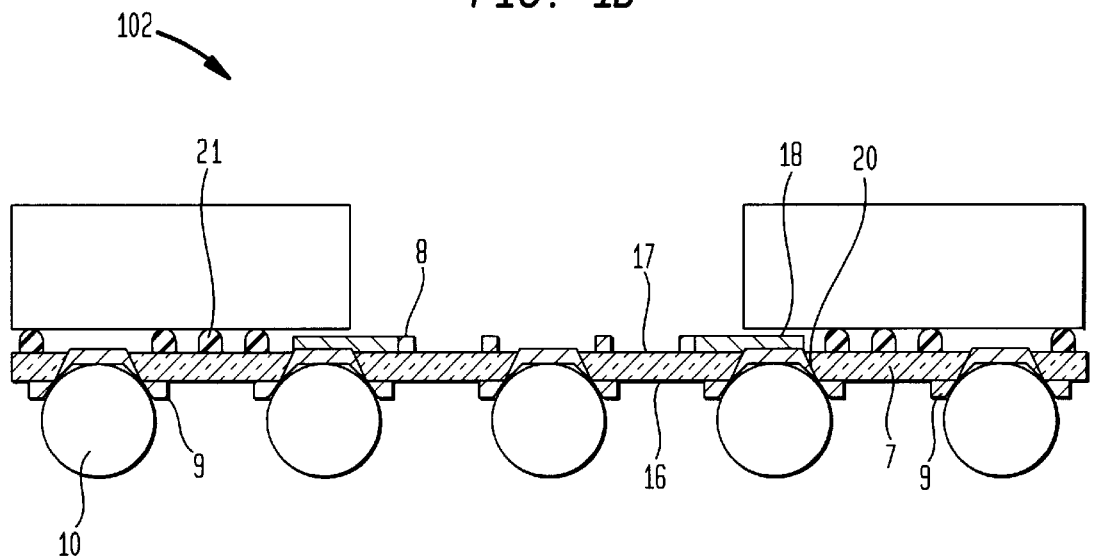
FIG. 1B is a side view of the translator of the electronic assembly of the present invention.

FIG. 1B depicts a side view of translator 102 before it has been connected with semiconductor chip package 101. The array of second translator terminals 9 is disposed on the second surface of the support element. Second translator terminals are disposed on the peripheral region of such support element. As is depicted in FIG. 1A, second translator terminals 9 may be disposed over both the central and peripheral regions of the support element.

As depicted in FIG. 1B, the array of second translator terminals 9 is disposed on the second surface of the support element. Although such terminals may be disposed on the first surface and/or the second surface of the support element, typically the second translator terminals are disposed on only one of such surfaces. Each of the second translator terminals must be exposed to the second surface of the support element. If the second translator terminals are disposed on the first surface, the support element should also include a plurality of holes which are in registration with the array of second translator terminals. Each hole should extend from the second surface of the support element to one of the second terminals. The array of first translator terminals 8 depicted in FIG. 1B is disposed on the first surface of the support element. Although such terminals may be disposed on the first surface and/or the second surface of the support element, typically such first translator terminals are disposed on only one of such surfaces. Each of the first translator terminals must be exposed to the first surface of the support element. If the first translator terminals are disposed on the second surface, the support element should also include a plurality of holes which are in registration with the array of first translator terminals. Each hole should extend from the first surface of the support element to one of the first translator terminals. In preferred embodiments, the first translator terminals are disposed on the first surface and the second translator terminals are disposed on the second surface. The translator may also include passive and/or active components such as capacitors, inductors, resistors, transistors, etc.

Figure 2A:
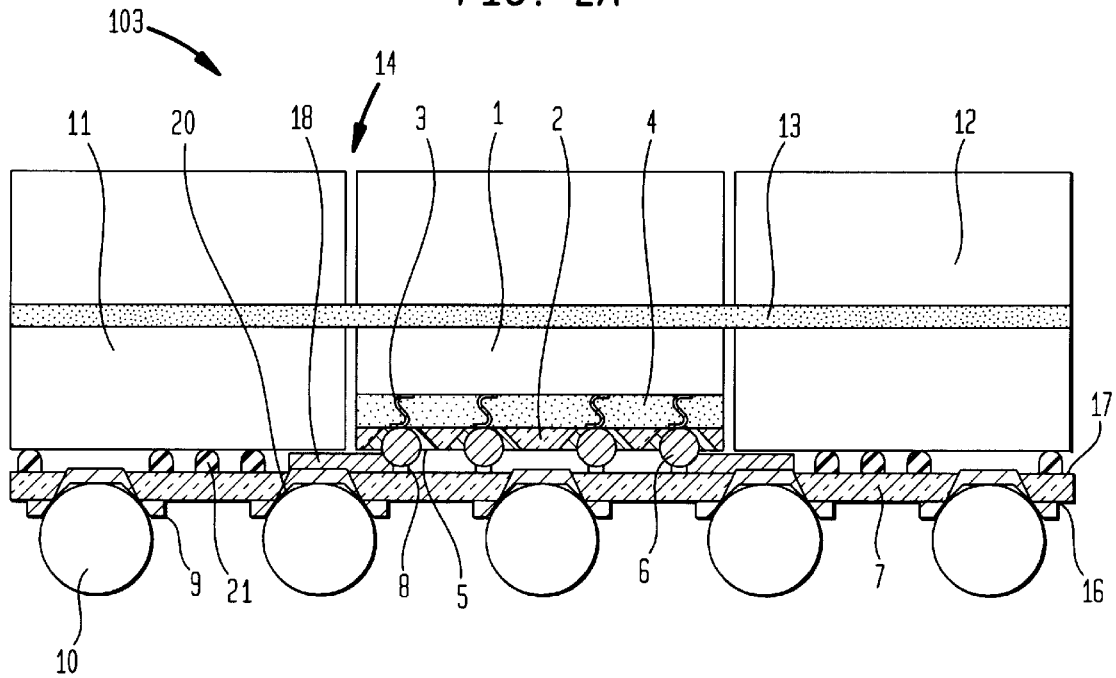
FIG. 2A is a side view of the electronic assembly according to another embodiment of the present invention.

FIG. 2A depicts an electronic assembly of another embodiment of the present invention which is similar to that shown in FIGS. 1A and 1B. Electronic assembly 103 is different from electronic assembly 100 which is depicted in FIG. 1A in that electronic assembly 103 further comprises a heat spreader 12 which is adhered to stiffener 11 with an adhesive 13. Heat spreader has a plurality of ports 14. Such ports can be used to encapsulate the assembly.

Figure 2B:
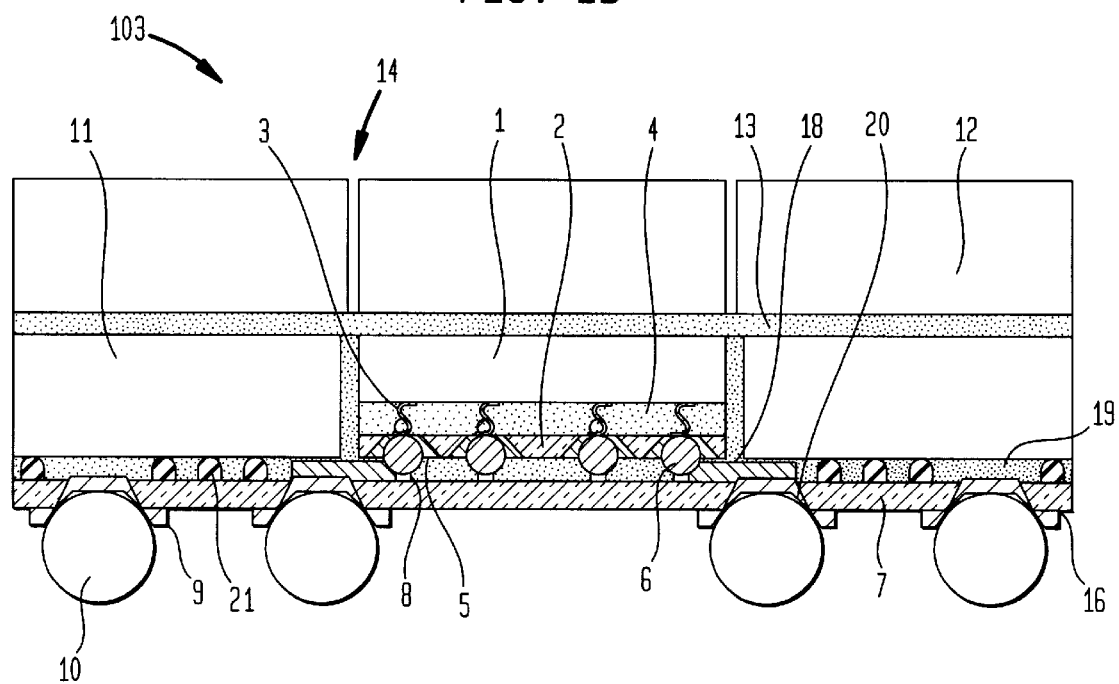
FIG. 2B is a side view of the electronic assembly according to another embodiment of the present invention.

FIG. 2B depicts an electronic assembly according to another embodiment of the present invention. Electronic assembly 104 can be prepared by injecting a liquid composition into assembly 104 between the first surface 17 and the stiffener 11 or through ports 14. The liquid composition cures to a compliant encapsulant 19 and together with compliant spacers 21 form a compliant ring which is disposed over the peripheral region of the first surface 17 of support element 7. The liquid composition may also be used to form a compliant layer between the semiconductor chip package 101 and translator 102, as shown in FIG. 2B.

Figure 3A:
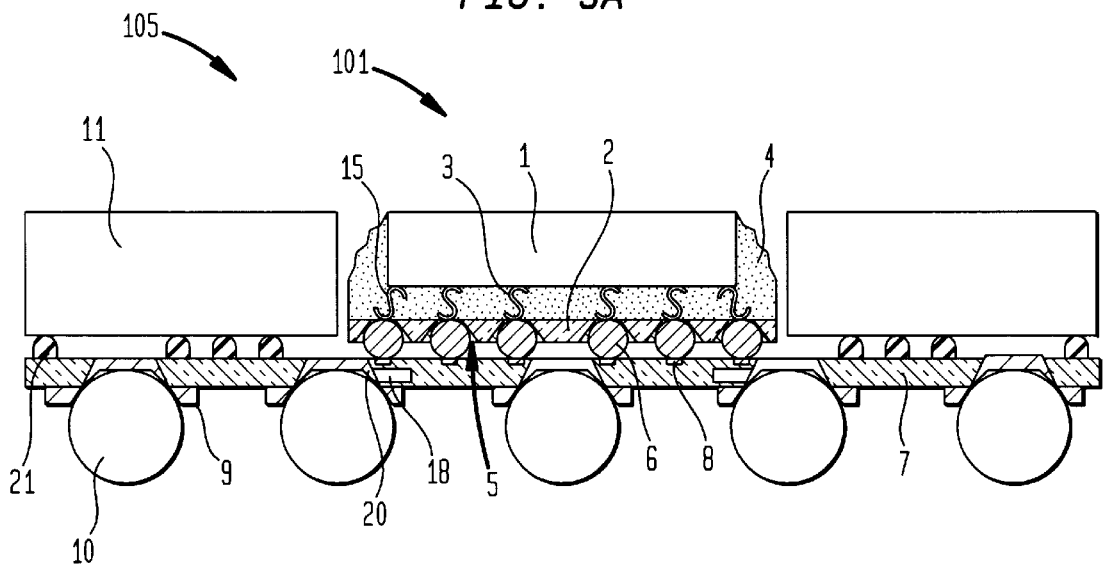
FIG. 3A is a side view of the electronic assembly according to another embodiment of the present invention.

FIG. 3A depicts an electronic assembly of another embodiment of the present invention. The semiconductor chip package 101 of electronic assembly 105 includes a plurality of fan-in leads 3 and a plurality of fan-out leads 15. The traces 18, which connect first translator terminals 8 to second-translator-terminals 9, are disposed within support element 7. Such traces may be disposed on the first surface 17, the second surface 16 and within support element 7. If support element 7 comprises more than one sheet-like dielectric layer, the traces may be disposed in one more of the sheet-like dielectric layer of support element 7, between such dielectric layers and/or on one or both of the first and second surfaces of support element 7. Typically the sheet-like dielectric layer or layers which comprises support element 7 are formed from a flexible material such as a polyimide. In preferred embodiments, the polyimide is 25–75 microns thick.

Figure 3B:
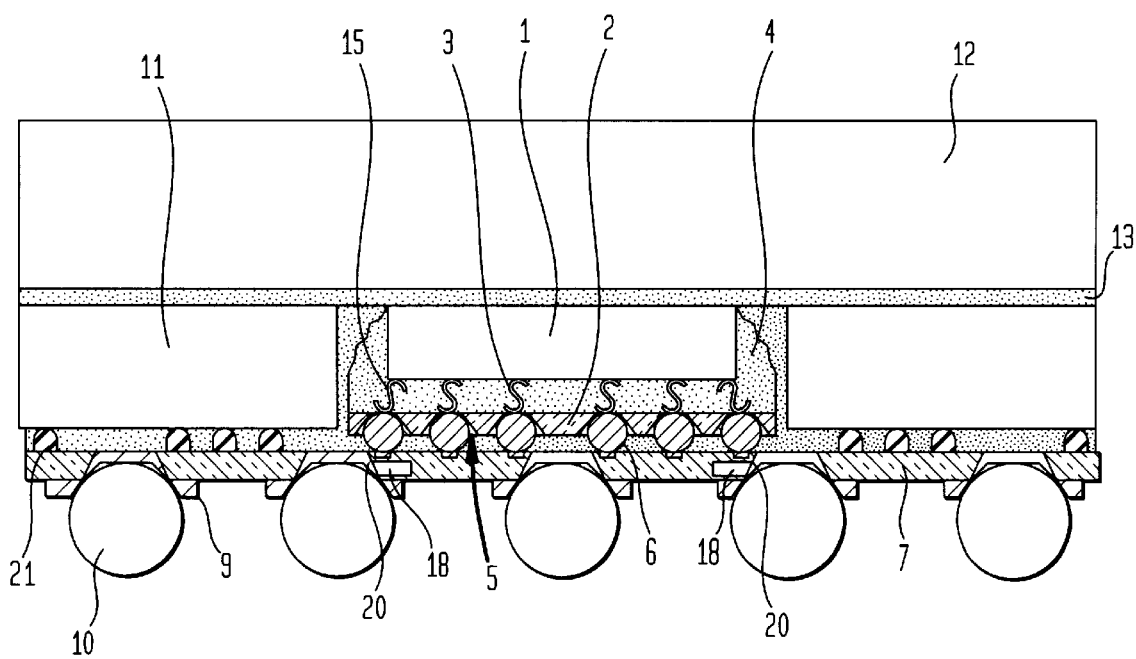
FIG. 3B is a side view of the electronic assembly according to another embodiment of the present invention.

FIG. 3B depicts the electronic assembly of FIG. 3A after a heat sink 12 has been adhered to stiffener 11 with adhesive 13; and after the assembly have been encapsulated with a compliant encapsulant 19.

Figure 4A:
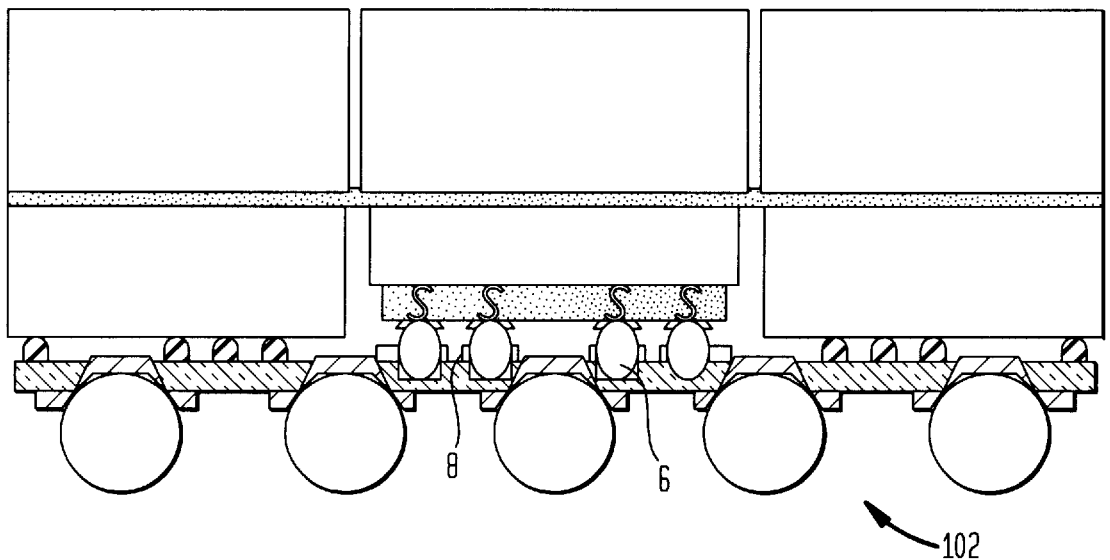
FIG. 4A is a side view of an electronic assembly of another embodiment of the present invention.
Figure 4B:
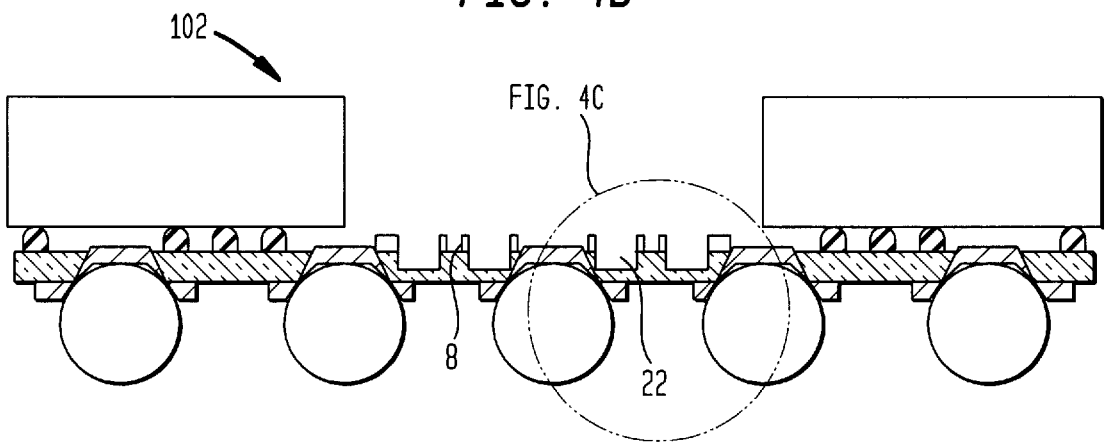
FIG. 4B is a side view of the translator of the electronic assembly of FIG. 4A.

FIG. 4A depicts an electronic assembly of another embodiment the present invention which includes the translator of FIG. 4B. Translator 102 is similar to the translator of FIG. 3A and 3B. The translator depicted in FIGS. 4a and 4B is different in that such translator is in the form of a socket and includes a plurality of holes 22. One of the first translator terminals 8 is disposed around each hole 22. Each first translator terminal 8 extends inwardly over hole 22 and is adapted to resiliently engage solder ball 6. The support element defining each hole 22 is preferably in the shape of a plurality of finger-like projections which extend toward a common center. Preferred shapes for hole 22 are described in commonly assigned U.S. Pat. Nos. 5,615,824 and 5,632,631 and U.S. patent application Ser. Nos. 08/862,151, filed on May 22, 1997; and 08/254,991 filed on Jun. 7, 1994.

Figure 4C:
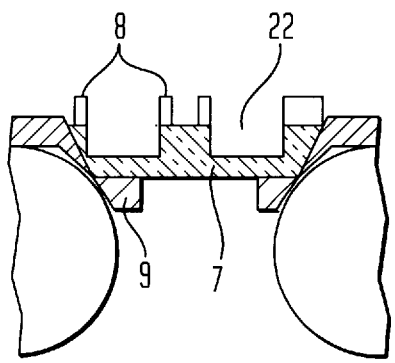
FIG. 4C is an exploded side view of a portion of the translator of FIG. 4B.

FIG. 4B depicts the translator 102 of FIG. 4A. FIG. 4C is an exploded view of a portion of the translator depicted in FIG. 4B.

None of the Figures described above have been drawn to scale so no measurements should be taken from a drawing to determine the relative size of the elements contained therein. Variation & combinations of the features described above can be utilized without departing from the present invention as defined by the claims. The foregoing description should be taken as illustrations of, rather than limitations of, the claimed invention.

What is claimed is:

1. An electronic assembly, comprising:
   A. a semiconductor chip package having a face surface, a plurality of package terminals disposed on the face surface, and a semiconductor chip, wherein said package terminals are arranged in an array having a first pitch; and
   B. a translator, comprising;
      a. a flexible, sheet-like support element having a first surface, a second surface opposite the first surface, a peripheral region, and a central region defined by the peripheral region, said peripheral region being more rigid than the central region;
      b. a plurality of first translator terminals wherein first translator terminals are disposed on the central region of the support element, exposed at the first surface of the support element, and arranged in an array having said first pitch;
      c. a plurality of second translator terminals wherein second translator terminals are exposed at the second surface of the support element and arranged in an array having a pitch which is different than the first pitch and wherein at least some of the second translator terminals are disposed on the peripheral region of the support element; and
      d. a plurality of traces electrically interconnecting the package terminals and the first translator terminals.

2. The electronic assembly of claim 1, wherein the peripheral region of the support element is comprised of a flexible, sheet-like layer and a stiffener disposed over the sheet-like layer.

3. The electronic assembly of claim 2, wherein the stiffener has a central hole disposed over the central region of the support element.

4. The electronic assembly of claim 3, further comprising a compliant ring disposed between the stiffener and the flexible, sheet-like layer.

5. The electronic assembly of claim 4, wherein the compliant ring is comprised of a material selected from the group consisting of silicone gels, silicone elastomers and flexibilized epoxies.

6. The electronic assembly of claim 4, further comprising a compliant encapsulant disposed between the semiconductor chip package and the translator.

7. The electronic assembly of claim 1, wherein the array of first translator terminals are disposed on the first surface of the support element.

8. The electronic assembly of claim 1, wherein the array of second translator terminals are disposed on the second surface of the support element.

9. The electronic assembly of claim 7, wherein the semiconductor chip package further comprises a plurality of electrically conductive first joining units, wherein each of the first joining units is connected to one of the package terminals and one of the first translator terminals.

10. The electronic assembly of claim 9, wherein each of the first joining units is a solder ball.

11. The electronic assembly of claim 1, wherein
   the semiconductor chip package has a plurality of first joining units,
   the support element has a plurality of apertures,
   the array of first translator terminals are disposed on the second surface of the support element, and
   each of the first translator terminals is disposed over one of the apertures.

12. The electronic assembly of claim 11, wherein the support element further comprises a plurality of holes; and each of the first translator terminals is disposed over one of the holes, extends inwardly over the hole and is adapted to resiliently engage a respective package terminal.

13. The electronic assembly of claim 1, wherein
   the semiconductor chip package further comprises a plurality of electrically conductive first joining units, wherein each of the first joining units is connected to one of the package terminals and one of the first translator terminals; and
   the translator further comprises a plurality of electrically conductive second joining units, wherein each of the second joining units is connected to one of the second translator terminals.

14. The electronic assembly of claim 13, wherein each first joining unit is comprised of a first solder, each second joining unit is comprised of a second solder and the solidus temperature of the first solder is higher than the liquidus temperature of the second solder.

15. The electronic assembly of claim 1, further comprising a heat spreader disposed over the support element.

16. The electronic assembly of claim 1, wherein the first pitch is less than 750 µm.

17. The electronic assembly of claim 16, wherein the pitch of the array of second translator terminals is greater than 1000 µm.

18. The electronic assembly of claim 1, wherein the semiconductor chip has a plurality of electrically conductive contacts; and the semiconductor chip package further comprises
   a dielectric layer; wherein the array of package terminals is disposed on the dielectric layer;
   a compliant layer disposed between the semiconductor chip and the dielectric layer; and
   a plurality of leads extending through the compliant layer, each of said leads connecting one of the contacts to one of the package terminals.

19. The electronic assembly of claim 18, wherein at least some of the leads are fan-out leads.

20. The electronic assembly of claim 19, wherein at least some of the leads are fan-in leads.

21. The electronic assembly of claim 1, wherein at least some of the package terminals are interconnected by traces disposed on the support layer.

22. The electronic assembly of claim 1, wherein the support element further comprises a least one feature selected from the group consisting of ground planes and potential power planes.

23. The electronic assembly of claim 1, wherein the support element further comprises one or more components selected from the group consisting of active and passive microelectronic components.

24. The electronic assembly of claim 1, wherein the translator further comprises a plurality of electrically conductive second joining units, wherein each of the second joining units is connected to one of the second translator terminals; and the electronic assembly further comprises an external substrate having a top surface and a plurality of electrically conductive connection pads disposed on the top surface, wherein each of the connection pads is electrically interconnected to one of the second joining units.

25. The electronic assembly of claim 1, wherein the semiconductor chip package father comprises a dielectric layer.

26. The electronic assembly of claim 25, wherein the dielectric layer is flexible.

27. The electronic assembly of claim 26, wherein the package terminals are disposed on the flexible dielectric layer.

* * * * *

UNITED STATES PATENT AND TRADEMARK OFFICE
CERTIFICATE OF CORRECTION

PATENT NO. : 6,114,763
DATED : September 5, 2000
INVENTOR(S) : Smith

It is certified that error appears in the above-identified patent and that said Letters Patent is hereby corrected as shown below:

<u>Column 1,</u>
Line 13, "to art" should read -- to the art --.
Line 20, "chips" should read -- chips", --.
Line 40, "interconnection" should read -- interconnections --.
Line 56, "266" should read -- 266, --.

<u>Column 2,</u>
Line 13, "packages" should read -- package --.
Line 30, "process" should read -- processing --.
Line 62, "have" should read -- has --.

<u>Column 3,</u>
Line 13, "pitch the" should read -- pitch of the --.
Line 13, "bard" should read -- board --.
Line 18, delete "present".
Line 28, holes is" should read -- holes and --.
Line 37, "a" should read -- an --.
Line 42, "a" should read -- an --.
Line 56, "process" should read -- processing --.
Line 57, "which" should read -- with --.
Line 66, delete "of the".

Signed and Sealed this

Twenty-fourth Day of July, 2001

Attest:

NICHOLAS P. GODICI
Attesting Officer    Acting Director of the United States Patent and Trademark Office